United States Patent
Pawlowski

(10) Patent No.: US 6,215,724 B1
(45) Date of Patent: *Apr. 10, 2001

(54) CIRCUIT AND METHOD FOR ELIMINATING IDLE CYCLES IN A MEMORY DEVICE

(75) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/525,868

(22) Filed: Mar. 14, 2000

Related U.S. Application Data

(63) Continuation of application No. 09/290,727, filed on Apr. 12, 1999, now Pat. No. 6,064,624, which is a continuation of application No. 08/931,779, filed on Sep. 16, 1997, now Pat. No. 5,917,772.

(51) Int. Cl.[7] ........................................... G11C 8/00
(52) U.S. Cl. .................. 365/230.06; 365/230.08; 365/230.02; 365/189.01
(58) Field of Search .................. 365/230.06, 230.08, 365/189.02, 189.04, 189.05, 189.11, 189.12, 230.02

(56) References Cited

U.S. PATENT DOCUMENTS

| | | | |
|---|---|---|---|
| 5,377,338 | 12/1994 | Olson et al. | 395/375 |
| 5,384,745 | 1/1995 | Konishi et al. | 365/230.03 |
| 5,572,467 | 11/1996 | Ghassemi et al. | 365/189.02 |
| 5,717,904 | 2/1998 | Ehlers et al. | 395/11 |
| 5,757,704 | 5/1998 | Hachiya | 365/189.07 |
| 5,793,688 | 8/1998 | Mclaury | 365/203 |
| 5,917,772 | 6/1999 | Pawlowski | 365/230.06 |
| 6,064,624 | * 5/2000 | Pawlowski | 365/230.06 |

* cited by examiner

Primary Examiner—David Nelms
Assistant Examiner—David Lam
(74) Attorney, Agent, or Firm—Kirkpatrick & Lockhart LLP

(57) ABSTRACT

A data input circuit including a first input register, a second input register, and a write driver connected to the second input register. The first and second input registers are preferably series-connected. In the preferred embodiment, a multiplexer selectively connects one of the first and second input registers to the write driver. The input circuit may be embodied in a memory device and in memory systems.

51 Claims, 5 Drawing Sheets

| CLK | 1 | 2 | 3 | 4 | 5 | 6 | 7 | 8 | 9 | 10 | 11 | 12 |
|---|---|---|---|---|---|---|---|---|---|---|---|---|
| Address Register | $A_1$ | $A_1$ | $A_2$ | $A_2$ | $A_3$ | $A_4$ | $A_5$ | $A_6$ | $A_7$ | $A_7$ | $A_7$ | $A_8$ |
| Burst Logic | $A_1$ | $A_{1+1}$ | $A_2$ | $A_{2+1}$ | $A_3$ | $A_4$ | $A_5$ | $A_6$ | $A_7$ | $A_{7+1}$ | $A_7$ | $A_8$ |
| 1st Write Address Register | $A_y$ | $A_1$ | $A_{1+1}$ | $A_{1+1}$ | $A_{1+1}$ | $A_3$ | $A_4$ | $A_5$ | $A_5$ | $A_7$ | $A_{7+1}$ | $A_{7+1}$ |
| 2nd Write Address Register | $A_x$ | $A_y$ | $A_1$ | $A_1$ | $A_1$ | $A_{1+1}$ | $A_3$ | $A_4$ | $A_4$ | $A_5$ | $A_{7+1}$ | $A_7$ |
| Write Register | high | high | low | low | high | high | high | low | high | high | high | low |
| 1st Input Enable Register | high | high | low | low | high | high | high | low | high | high | low | low |
| 2nd Input Enable Register | ??? | high | high | low | low | high | high | high | low | high | high | low |
| 1st Input Register | $D_y$ | ??? | $D_1$ | $D_{1+1}$ | $D_{1+1}$ | $D_1$ | $D_3$ | $D_4$ | $D_5$ | $D_5$ | $D_7$ | $D_{7+1}$ |
| 2nd Input Register | $D_x$ | ??? | ??? | $D_1$ | $D_1$ | $D_1$ | $D_{1+1}$ | $D_3$ | $D_4$ | $D_4$ | $D_5$ | $D_7$ |
| Array Operation | Write $D_x$ | Write $D_y$ | Read $Q_2$ | Read $Q_{2+1}$ | Write $D_1$ | Write $D_{1+1}$ | Write $D_3$ | Read $Q_6$ | Write $D_4$ | Write $D_5$ | IDLE | Read $Q_8$ |

FIG. 4

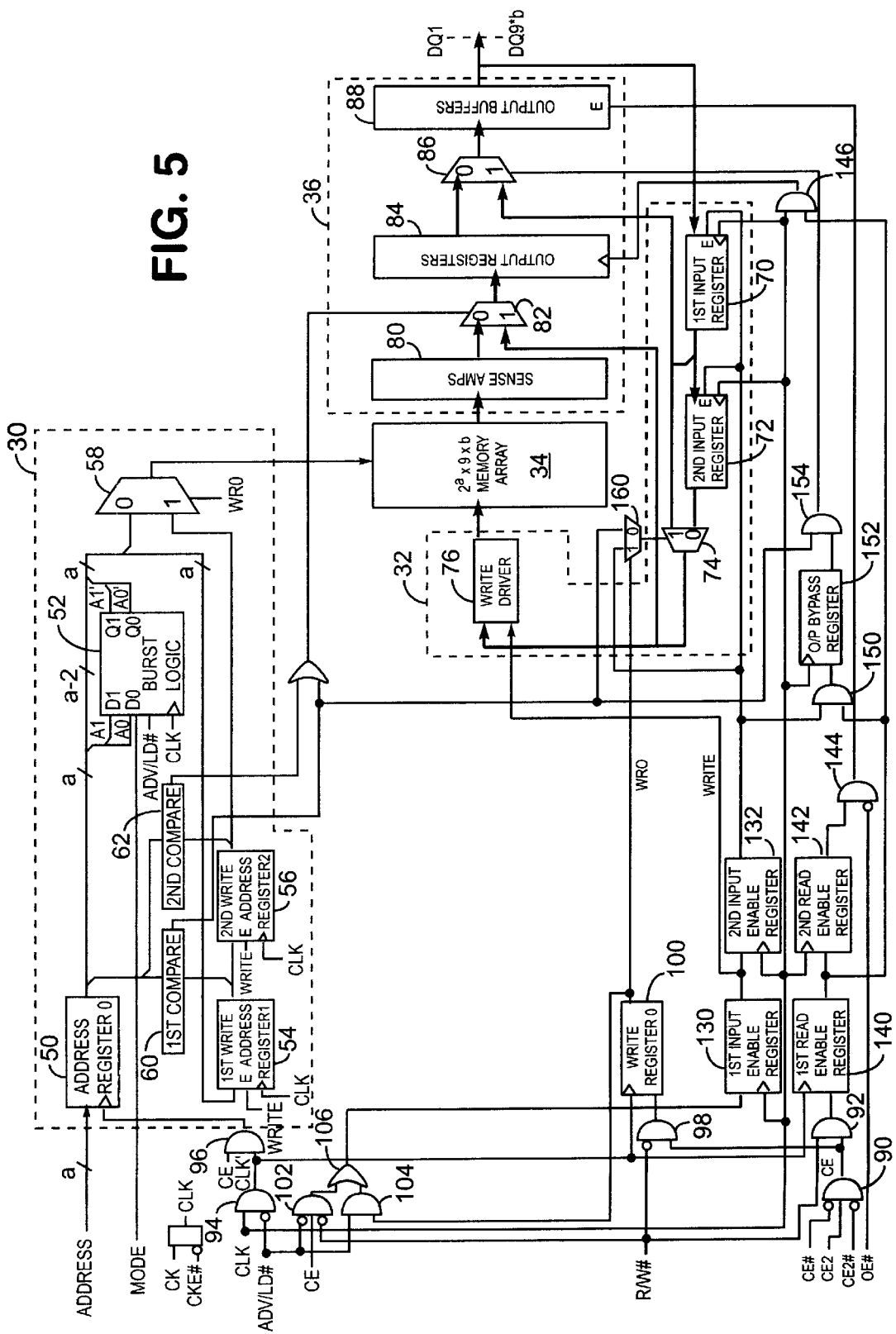

CIRCUIT AND METHOD FOR ELIMINATING IDLE CYCLES IN A MEMORY DEVICE

CROSS REFERENCE TO RELATED APPLICATIONS

This is a continuation of U.S. patent application Ser. No. 09/290/727, filed Apr. 12, 1999 now U.S. Pat. No. 6,064,624, which is a continuation of U.S. patent application Ser. No. 08/931,779, filed Sep. 16, 1997, now U.S. Pat. No. 5,917,772.

STATEMENT REGARDING FEDERALLY SPONSORED RESEARCH OR DEVELOPMENT

Not Applicable.

BACKGROUND OF THE INVENTION

1. Field of the Invention

The present invention is directed generally to an input circuit to be used, for example, in a memory device, and a method for operating the input circuit and memory device. More particularly, the present invention is directed to an input circuit and method that eliminates idle cycles in a memory device through the use of input registers.

2. Description of the Background

Memory devices, such as static random access memories (SRAMs), typically include a memory array for storing data, an address circuit for accessing the memory array, a write circuit for writing data to the memory array, and a read circuit for reading data from the memory array. In pipelined memory devices, data is typically read from a memory array during one clock cycle and provided on the data bus during the next clock cycle. Similarly, data to be written to a memory array is typically latched from the data bus during one clock cycle and written to the memory array during the next clock cycle. As a result, in a pipelined memory device a read operation followed by a write operation will typically require that the memory device be idle for at least one clock cycle while a previous operation is completed and the next operation is begun. Those idle cycles can significantly reduce the operating speed of a memory device.

Thus, the need exists for a pipelined memory device in which idle cycles during data transfers to and from the memory device are eliminated.

BRIEF SUMMARY OF THE INVENTION

The present invention is directed to a data input circuit. The input circuit includes a first data input register, a second data input register, and a write driver connected to the first and second data input registers. The first and second data input registers are preferably series-connected and, in the preferred embodiment, a multiplexer selectively connects one of the first and second data input registers to the write driver.

The present invention may be embodied as a memory device, including an address circuit, a write circuit, a memory array, and a read circuit. The write circuit includes first and second data input registers and is constructed in accordance with the present invention. The memory array is connected to the address circuit, the write circuit, and the read circuit. Memory devices constructed in accordance with the present invention may also be used to form a memory system.

The present invention is also directed to a method of operating a memory device. The method includes storing data associated with a first address, storing data associated with a second address, storing data indicative of the first address, storing data indicative of the second address, executing a read operation, and executing a write operation. Executing a write operation is performed without resulting in an idle cycle between the read operation and the write operation. Executing a write operation also uses data associated with one of the first and second addresses, and uses data indicative of one of the first and second addresses. The order of executing the method may be interchanged, as will be understood from the detailed description provided hereinbelow.

The present invention solves problems experienced with the prior art because it eliminates idle cycles between read and write operations in a memory device, thereby increasing the bandwidth of the device. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein:

FIG. 4 is a chart illustrating the state of various components in the memory device from FIG. 2; and FIG. 5 is a combination block diagram and circuit schematic illustrating one of the memory devices from FIG. 1 embodied without byte write logic.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical input circuit, memory device, and memory system. Those of ordinary skill in the art will recognize that other elements may be desirable and/or required to implement the present invention. However, because such elements are well known in the art, and because they do not facilitate a better understanding of the present invention, a discussion of such elements is not provided herein. Regarding notation, a signal designation followed by a pound sign ("#") indicates that the signal is a logical complement of a signal having the same designation but without the pound sign. For example, signal CE1# is the logical complement of signal CE1. Similarly, input and output terminal designations that are followed by a pound sign are active low inputs and outputs. For example, chip enable terminal CE2# is active low, meaning that the chip is enabled when a low logic signal is present at terminal CE2#, assuming that all other conditions for enablement are also met. Conversely, input and output terminals without a pound sign are active high.

Figure 1:
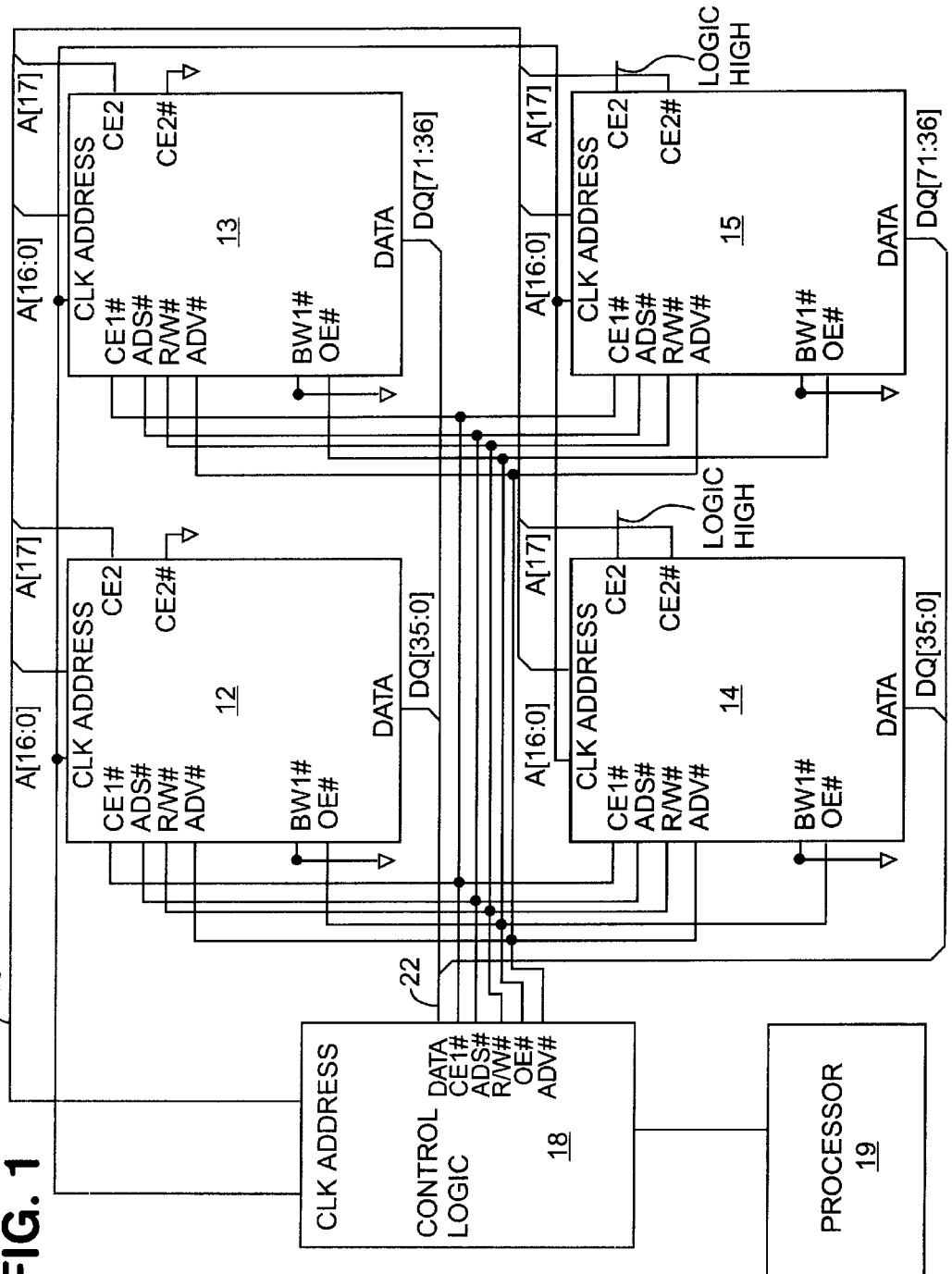
FIG. 1 is a high-level block diagram illustrating a memory system including four memory devices, each constructed in accordance with the present invention.

FIG. 1 is a high-level block diagram illustrating a memory system 10 including four memory devices 12, 13, 14, 15 and control logic 18. Each memory device 12–15 is constructed in accordance with the present invention. Although the memory system 10 is illustrated as being formed from four memory devices 12–15, the present invention may be implemented with more memory devices or as few as one memory device. The memory devices 12–15 are preferably synchronous, static random access memories (SRAM), although other memory devices, such as synchronous dynamic random access memories, may also be used with the present invention. In the preferred embodiment, the control logic 18 acts as an interface between the memory devices 12–15 and a processor 19. The control logic 18 is preferably an application specific integrated circuit (ASIC).

The processor 19 may be any conventional single-chip or multi-chip microprocessor, such as a Pentium® processor, Pentium® Pro processor, a 8051 processor, a MIPS® processor, a Power PC® processor, or an ALPHA® processor. In addition, the processor 19 may be any conventional special purpose microprocessor, such as a digital signal processor or a graphics processor. The processor 19 may be implemented with conventional address lines, conventional data lines, and a number of conventional control lines.

The components forming the memory system 10, including the memory devices 12–15, control logic 18, and processor 19, may be fabricated using any one of many different technologies, including silicon-on-insulator technology, silicon-on-sapphire technology, and thin film transistor technology. The preferred embodiment of the present invention is fabricated on a silicon substrate using a conventional doping technology.

The memory devices 12–15 each receive three chip enable signals at chip enable terminals CE1#, CE2, and CE2#. Chip enable terminals CE1# receive signals from the control logic 18 and are used to disable the memory devices 12–15. For example, the memory devices 12–15 may be disabled to prevent read and write operations, to prevent new addresses from being accessed within the memory devices 12–15, to block address interrupt signals, and to conserve power during periods of non-use. In memory devices 12, 13, terminals CE2 are connected to the most significant bit A[17] on address bus 20 so that those memory devices 12, 13 form high memory in the system 10. In memory devices 14, 15, terminals CE2# are connected to the most significant bit A[17] on the address bus 20 so that those memory devices 14, 15 form low memory in the system 10. The remaining enable terminals are not needed in the system 10, and they are biased in an enabled state. If additional memory devices are added to the system 10, the unused chip enable terminals may be used to selectively control the memory devices in a manner similar to that implemented with the other chip enable terminals.

The control logic 18 provides address signals to the memory devices 12–15 over the address bus 20 and provides data signals to the memory devices 12–15 over a data bus 22. The control logic 18 also provides the memory devices 12–15 with a clock signal CLK, the chip enable signal CE#, an address strobe signal ADS#, a read/write signal R/W#, and an output enable signal OE#.

The memory devices 12–15 have other signal terminals that are not required for a clear understanding of the present invention. To clarify the description of the invention, those terminals are not illustrated. The byte write signals BW1# are tied to ground so they are always enabled. In an alternative embodiment, however, those signals may be individually controlled.

Figure 2:
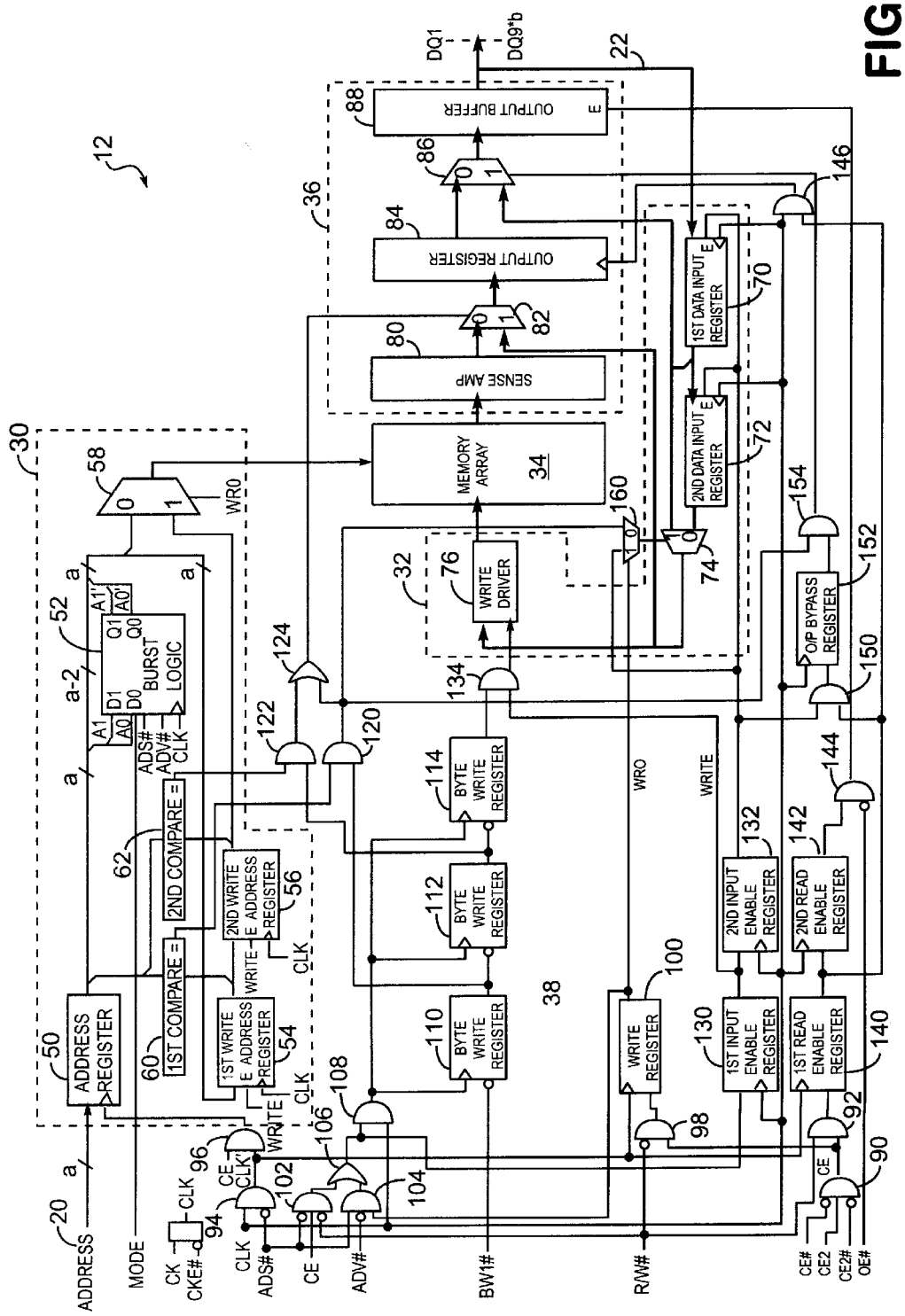
FIG. 2 is a combination block diagram and circuit schematic illustrating one of the memory devices from FIG. 1.

FIG. 2 is a combination block diagram and circuit schematic illustrating the memory device 12 from FIG. 1 embodied as a pipelined burst memory device. Memory device 12 is substantially identical to the other memory devices 13–15, and the description of memory device 12 is also an accurate description of the other memory devices 13–15. The memory device 12 includes an address circuit 30, a write circuit 32, a memory array 34, a read circuit 36, and a control circuit 38.

The memory array 34 receives address signals from the address circuit 30 through the address bus 20. Data to be written to the memory array 34 is provided from data bus 22 through the write circuit 32, and data to be read from the memory array 34 is provided through the read circuit 36 to the data bus 22.

The address circuit 30 receives address signals from the address bus 20 and latches those signals with an address register 50. Burst logic 52 is connected to an output terminal of the address register 50 and provides burst logic address data. A first write address register 54 is connected to an output terminal of the burst logic 52 and latches the address data produced by the burst logic 52. A second write address register 56 is connected to an output terminal of the first write address register 54. Each of the first and second write address registers 54, 56 stores an address to be written to in the memory array 34. A multiplexer 58 is connected to both the output terminal of the burst logic 52 and an output terminal of the second write address register 56. The multiplexer 58 selectively connects one of the burst logic 52 and the second write address register 56 to the memory array 34. A first compare circuit 60 is connected to the output terminal of the address register 50 and the output terminal of the first write address register 54, and produces an output signal indicative of whether the address latched by address register 50 is the same as the address latched by first write address register 54. A second compare circuit 62 is connected to the output terminal of address register 50 and the output terminal of second write address register 56, and produces an output signal indicative of whether the address latched by address register 50 is the same as the address latched by the second write address register 56.

The burst logic 52 will now be described in more detail. The burst logic 52 diverts the two least significant address bits A0, A1 from the address register 50 and produces two new address bits A0', A1'. A total of four address locations may be generated by the burst logic 52 by manipulating the two least significant address bits. The burst logic 52 is controlled by an address strobe signal ADS#, an advance signal ADV#, and a MODE signal. The address strobe signal ADS# controls whether the burst logic 52 latches a new set of address bits A0, A1 from the address register 50. If the burst logic 52 is not latching a new set of address bits A0, A1, the advance signal ADV# controls whether the burst logic 52 increments the previously latched address bits A0, A1 with each CLK signal. The MODE signal determines the manner, either linear or interleaved, in which the burst logic 52 increments the latched address bits. In linear mode, the burst logic 52 acts as a binary counter, beginning with the address signals A0, A1 provided by address register 50, incrementing the address signals A0', A1' with each CLK signal, and wrapping around to zeros in the event of an overflow (ie. when an increment occurs with both A0'and A1' having logic values of one). In interleaved mode, the burst logic 52 uses the following formula for incrementing the address bits:

start value: A1' A0' next value: A1' A0'# next value: A1'# A0' next value: A1'# A0'#.

The burst logic 52 may also be modified to suit particular applications. For example, the burst logic 52 may control more or less address bits than illustrated in the preferred embodiment. In an extreme modification, the burst logic 52 may control all of the address bits, so that the burst logic 52 completely separates the address register 50 from the multiplexer 58 and the first write address register 54. The memory device 12 may, of course, be constructed without the burst logic 52 so that each new address is externally generated and provided over the address bus 20.

The write circuit 32 includes a first data input register 70 for latching data on the data bus 22. A second data input register 72 is connected to an output terminal of the first data input register 70. A multiplexer 74 is connected to the output terminal of the first data input register 70 and an output terminal of the second data input register 72 and selectively connects one of the first and second data input registers 70, 72 to a write driver 76. The write driver 76 receives a data signal from the multiplexer 74 and drives that signal to write data to the memory array 34. In an alternative embodiment, the multiplexer 74 may be eliminated and the write driver 76 may receive data signals only from the second data input register 72. That embodiment, however, is believed to be less efficient than the preferred embodiment.

The read circuit 36 includes a sense amplifier 80 connected to the memory array 34. Signals indicative of data stored in the memory array 34 are typically very weak and the sense amplifier 80 senses and amplifies those signals. A multiplexer 82 is connected to an output terminal of the sense amplifier 80 and to the output terminal of multiplexer 74, and selectively connects one of those devices to an output register 84. Similarly, multiplexer 86 is connected to output register 84 and to the output terminal of the first data input register 70, and selectively connects one of those devices to output buffer 88. Output buffer 88 is connected to multiplexer 86 and places data onto the data bus 22.

The control circuit 38 receives control signals, such as those provided by the control logic 18 (shown in FIG. 1), and produces control signals used by the address circuit 30, the write circuit 32, and the read circuit 36. The control signals include the CLK signal, the address strobe signal ADS#, the address advance signal ADV#, the byte write signal BW1#, the read/write signal R/W#, the chip enable signals CE1#, CE2, CE2#, and the output enable signal OE#.

An AND gate 90 receives the chip enable signals CE1#, CE2, CE2#, and generates an output signal CE indicative of whether the memory device 12 is enabled. An AND gate 92 logically combines chip enable signal CE with read/write signal R/W# to produce an output signal indicative of whether the memory device 12 is both enabled and enabled to read data from the memory array 34.

An AND gate 94 logically combines the CLK signal and the address strobe signal ADS# to generate a modified clock signal CLK'. In the preferred embodiment, read and write operations are performed on the rising edge of the CLK signal. In addition, read and write operations are initiated when the address strobe signal ADS# is in a logic low state. As a result, the modified clock signal CLK' produced by AND gate 94 is substantially the same as the CLK signal as long as the address strobe signal ADS# is in a logic low state.

AND gate 96 logically combines modified clock signal CLK' and signal CE from AND gate 90, and produces a signal used to clock address register 50. The address register 50 latches signals from the address bus 20 on the rising edge of the modified clock signal CLK'.

AND gate 98 logically combines signal CE from AND gate 90 with read/write signal R/W#, and produces a signal indicative of whether the memory device 12 is both enabled, as indicated by signal CE, and enabled to write data to the memory array 34, as indicated by signal R/W#.

Write register 100 receives the output of AND gate 98 and is clocked with modified clock signal CLK'. Write register 100 produces a signal WR0.

Logic gates 102, 104, 106 logically combine signals ADS#, CE, ADV#, and WR0 to produce a signal indicative of whether the memory array 12 is enabled to write data to the memory array 34.

AND gate 108 logically combines the CLK signal with the output of logic gate 106 to produce a clock signal used with the byte write signal BW1#.

First, second, and third byte write registers 110, 112, 114, respectively, store successive byte write signals BW1#. The byte write signals are eventually used to enable the write driver 76. The byte write registers are clocked by the output of AND gate 108.

AND gate 120 logically combines the output of the first byte write register 110 with the output of the first compare circuit 60. AND gate 122 logically combines the output of the second byte write register 112 with the output of the second compare circuit 62. NOR gate 124 logically combines the outputs of AND gates 120, 122 and produces a signal for multiplexer 82 indicative of whether data stored in either the first input register 70 or the second input register 72 is being read. If data stored in one of the first and second input registers 70, 72 is being read, that data is provided to the output register 84 via multiplexer 82.

First and second input enable registers 130, 132 store successive signals indicative of whether the memory device 12 is enabled to write data to the memory array 34. The first input enable register 130 is connected to the output terminal of OR gate 106 and is clocked with the CLK signal. The second input enable register 132 is connected to an output terminal of the first input enable register 130 and is also clocked with the CLK signal. An output signal from the second input enable register 132 is used to enable the first and second input registers 70, 72.

AND gate 134 logically combines an output signal from first input enable register 130 with an output signal from the third byte write register 114, and produces a signal used to enable the write driver 76.

First and second read enable registers 140, 142 store successive signals from AND gate 92 indicative of whether the memory device 12 is both enabled and enabled to read data from the memory array 34. The first read enable register 140 is clocked with the modified clock signal CLK'. The second read enable register is clocked with the CLK signal and produces an output signal to an AND gate 144. The AND gate 144 logically combines the output signal from the second read enable register 142 with the output enable signal OE# and produces a signal used to enable the output buffer 88. AND gate 146 logically combines the output signal from the first read enable register 140 with the CLK signal and produces a signal used to clock the output register 84.

AND gate 150 logically combines the output signal from the first read enable register 140 with the output signal from the second input enable register 132 to produce a signal indicative of whether the memory device 12 is both currently enabled to write data to the memory array 34, and will be enabled to provide data read from the memory array onto the data bus 22 during the next clock cycle. Output ("O/P") bypass register 152 is connected to an output terminal of AND gate 150 and is clocked by CLK signal. AND gate 154 logically combines an output signal from output bypass register 152 with the output signal from AND gate 120 to produce a signal indicative of whether data stored in first input register 70 is being addressed. That signal is used to control the multiplexer 86. When data in first input register 70 is being addressed, that data is provided to the output buffer 88 through multiplexer 86.

Multiplexer 160 has a first input terminal connected to the output terminal of the second input enable register 132 and has a second input terminal connected to the output terminal of AND gate 120. Multiplexer 160 is controlled by signal WR0, and selectively connects one of its inputs to a control terminal of multiplexer 74. Multiplexer 160 selects which signal, either the output signal from the second input enable register 132 or the output signal from AND gate 120, will control multiplexer 74. When signal WR0 is a logic high, indicating that the memory device 12 is both enabled and enabled to write data to the memory array 34, the output signal from the second input enable register 132 controls multiplexer 74. When signal WR0 is a logic low, the output from AND gate 120 controls multiplexer 74.

Many modifications to the memory device 12 may be made. For example, multiple byte write signals may be used to separately control writing data to the memory array 34. To clearly described the present invention, the memory device 12 illustrated in FIG. 2 includes a single write driver 76 and a byte write circuit receiving only one byte write signal. As used herein, a byte write circuit is a collection of components used to selectively write a byte of data in the memory array 34. In an embodiment of the present invention utilizing a single write driver 76 and a byte write circuit receiving only one byte write signal, all bits of data are treated the same and are either written or not written to the memory array 34 at the same time. The present invention, however, may divide the data into two or more parts, typically dividing the data into bytes, and use the byte write circuit to separately control writing the parts, or bytes, of data. For example, in the preferred embodiment of the present invention, the memory array 34 has a data width of four nine-bit bytes. In that embodiment, four byte write signals are used to separately control each byte that is written to the memory array 34. Of course, more or less byte write signals may also be used. Each additional byte write signal may be accommodated with a circuit that duplicates byte write registers 110, 112, 114, and logic gate 134. In addition, one write driver 76 is preferably provided for each byte write signal. Although multiple byte write signals may be accommodated by duplicating the byte write registers 110, 112, 114, logic gate 134, and write driver 76 for each byte write signal, a modified circuit may be used to optimize or simplify the design and reduce the total number of components. For example, a single write driver 76 may be used to accommodate multiple signals from the byte write circuit.

If the byte write circuit is used to separately control more than one byte of data, other modifications to the memory device 12 may be desirable. For example, multiplexers 74, 82, 86, 160 may each be replaced by multiple multiplexers, one for each byte of data controlled by the byte write circuit. In that embodiment, the multiplexers replacing multiplexers 74, 160 allow for selective control of data from the first and second input registers 70, 72 to the write driver 76. The multiplexers replacing multiplexers 82, 86 allow for selective control of data provided to output register 84 and from output register 84 to output buffer 88. The additional multiplexers are controlled with signals from a logic circuit replacing logic gates 120, 122, 124, 154. That logic circuit may, for example, be formed by providing an equivalent to logic gates 120, 122, 124, 154 for each byte of data controlled by the byte write circuit. Other variations, of course, are possible.

In another embodiment, the first and second input registers 70, 72 may be parallel-connected and operated with a modified control circuit 38, such as one which separately enables or separately clocks the first and second input registers 70, 72.

FIGS. 3A–3J are timing diagrams illustrating the state of several signals present within the memory device 12. FIG. 3A illustrates the CLK signal. FIG. 3B illustrates address data present on the address bus 20 and received by the address circuit 30. FIG. 3C illustrates the read/write signal R/W#. FIG. 3D illustrates the byte write signal BW1#. FIG. 3E illustrates the address strobe signal ADS#. FIG. 3F illustrates the advance signal ADV#. FIG. 3G illustrates the chip enable signal produced by AND gate 70. FIG. 3H illustrates the output enable signal OE#. FIG. 3I illustrates data present on the data bus 22. FIG. 3J illustrates a description of the array operation performed during each clock cycle. FIG. 4 is a chart illustrating the state of various components in the memory device 12 illustrated in FIG. 2 during read and write operations defined by the timing diagrams illustrated in FIGS. 3A–3J. The state of several components is listed as "???", indicating that the state is unknown and requires knowledge of events occurring prior to clock cycle 1. The operation of the present invention will now be described with reference to FIGS. 3A–3J and FIG. 4.

Prior to clock cycle 1, two write operations have been requested. Data for those write operations are stored in first and second input registers 70, 72 as data Dy and Dx, respectively. Addresses for those write operations are stored in the first and second write address registers 54, 56 as addresses Ay and Ax, respectively.

During the first clock cycle, address A1 is latched from the address bus 20 by address register 50, read write signal R/W# is a logic low indicating that a write operation is to be performed, byte write signal BW1# represents a write command for address A1, address strobe signal ADS# is logic low to latch new address A1, the ADV# signal is a logic high to indicate that an address advance is not requested, the memory device 12 is selected as indicated by chip enable signal CE, and output enable signal OE# is logic high indicating that the output buffer 88 is not enabled. The write register signal WR0 produced by write register 100 is a logic high, so that address Ax stored in the second write address register 56 is passed through multiplexer 58 and to the memory array 34. Data Dx to be written to address Ax is written to the memory array 34 by write driver 76.

During the second clock cycle, address Ay is latched by the second write address register 56 and address A1 is latched by the first write address register 54. The address strobe signal ADS# is a logic high indicating that a new address will not be latched from the address bus 20 by address register 50. The advance signal ADV# is a logic low, indicating that address A1 previously latched by the address register 50 is incremented by the burst logic 52. The write register signal WR0 produced by write register 100 remains a logic high so that the address Ay latched by the second write address register 56 is passed through the multiplexer 58 and to the memory array 34. Data Dy is written to address Ay by write driver 76. Data to be written to address A1 appears on the data bus 22 during the second clock cycle and will be latched during the third clock cycle.

During the third clock cycle, read/write signal R/W# is logic high and the memory device 12 performs a read operation. Address A1 is latched by the second write address register 56, address A1+1 is latched by the first write address register 54, and a new address A2 is latched from the address bus 20 by the address register 50. Data D1, to be written to address A1, is latched from the data bus 22 by the first input register 70. Write register signal WR0 is a logic low, and as a result address A2 is passed from address register 50, through the multiplexer 58, and to the memory array 34. Data Q2 from address A2 is sensed and amplified by sense amp 80, passed through multiplexer 82, and is present at the input terminal of output register 84. Write addresses A1+1 and A1 remain in first and second write address registers 54, 56, respectively. Write Data D1+1 and D1 remain in first and second input registers 70, 72, respectively.

During the fourth clock cycle, data Q2, read from memory array 34 during the third clock cycle, is latched by output register 84, passes through multiplexer 86, and is placed on the data bus 22 by output buffer 88. The memory device 12 performs another read operation and burst logic 52 produces address A2+1, which is passed through multiplexer 58 to the memory array 34. Data Q2+1 in the memory array 34 is sensed and amplified by sense amplifier 80, passed through multiplexer 82, and is present at the input terminal of output register 84. Write addresses A1+1 and A1 remain in first and second write address registers 54, 56, respectively. Data D1+1 and D1 remain in first and second input registers 70, 72, respectively.

During the fifth clock cycle, the memory device 12 performs a write operation. Write register signal WR0 is a logic high and address A1 is passed from the second write address register 56, through the multiplexer 58, and to the memory array 34. A new address A3 is latched from the address bus 20 by address register 50. Write driver 76 is enabled and writes data D1 from the second input register 72 to the memory array 34. Also during the fifth clock cycle, data Q2+1, read from memory array 34 during the fourth clock cycle, is latched by output register 84, passes through multiplexer 86, and is placed on the data bus 22 by output buffer 88.

During the sixth clock cycle, the memory device 12 performs another write operation. Address A1+1 is latched by second write address register 56 and is passed through multiplexer 58 to the memory array 34. Address A3 is latched by the first write address register 54, and address A4 is latched from the address bus 20 by the address register 50. Data D1+1 passes from the first input register 70, through multiplexer 74, and is written to memory array 34 by write driver 76.

During the seventh clock cycle, the memory device 12 performs another write operation. Address A3 is latched by the second write address register 56 and is passed through the multiplexer 58 to the memory array 34. Address A4 is latched by the first write address register 54 and address A5 is latched from the address bus 20 by address register 50. Data D3 is latched from the data bus 22 by the first input register 70, is passed through the multiplexer 74, and is written to the memory array 34 by the write driver 76.

During the eighth clock cycle, the memory device 12 performs a read operation. Address A4 is latched by the second write address register 56 and address A5 is latched by the first write address register 54. Address A6 is latched from the address bus 20 by address register 50 and passes through multiplexer 58 to the memory array 34. Data Q6 is sensed and amplified by sense amplifier 80, passes through multiplexer 82, and is present at the input terminal of output register 84. Data D3 is latched by the second input register 72 and data D4 is latched from the data bus 22 by the first input register 70.

During the ninth clock cycle, the memory device 12 performs a write operation. Address A4 is passed from the second write address register 56, through multiplexer 58, and to the memory array 34. Address A5 remains latched by the first write address register 54 and address A7 is latched from the address bus 20 by address register 50. Data D4 is latched by the second input register 72 and is written to the memory array 34 by write driver 76. Data D5 is latched from the data bus 22 by the first input register 70.

During the tenth clock cycle, the memory device 12 performs another write operation. Address A5 is latched by the second write address register 56, passes through multiplexer 58, and to memory array 34. Address A7 is latched by the first write address register 54 and the burst logic 52 produces address A7+1. Data D5 passes from first input register 70, through multiplexer 74, and is written to memory array 34 by write driver 76. Data Q6, read from memory array 34 during the eight clock cycle, is latched by the output register 84, passed through multiplexer 86, and placed on data bus 22 by output buffer 88.

During the eleventh clock cycle, the memory device 12 is intentionally idle. The idle state is caused because both the ADV# signal and the ADS# signal are logic high. The idle cycle is intentional. The idle cycle may be generated, for example, because no data transfer is requested by the memory system 10 (shown in FIG. 1). Address A7 is latched by the second write address register 56 and address A7+1 is latched by the first write address register 54. Data D5 is latched by the second input register 72 and data D7 is latched from the data bus 22 by the first input register 70.

During the twelfth clock cycle, the memory device 12 performs a read operation. Address A7 remains latched by the second write address register 56, address A7+1 remains latched by the first write address register 54, and address A8 is latched by the address register 50. Address A8 is passed from the address register 50, through the multiplexer 58, and to the memory array 34. Data Q8 is sensed and amplified by sense amplifier 80, passed through multiplexer 82, and is present at input terminal of output register 84. Data D7 is latched by second input register 72 and data D7+1 is latched from the data bus 22 by first input register 70.

FIG. 5 is a combination block diagram and circuit schematic illustrating an alternative embodiment of the memory device 12 from FIG. 1. The memory device 12 illustrated in FIG. 5 contains less components than the memory device 12 illustrated in FIG. 2. The reduction in the number of components is a result of eliminating the use of byte write signals BW1#, and the elimination of the associated byte write registers 110, 112, 114 and logic. The memory device 12 illustrated in FIG. 5 does not allow for write control of individual bytes. The write driver 76 is enabled by the signal WRITE from the first input enable register 130. The operation of the memory device 12 illustrated in FIG. 5 is analogous to the operation of the memory device 12 illustrated in FIG. 2, except that byte write signals are not present and the write driver 76 is enabled by the output signal from the first input enable register 130.

Figure 3:
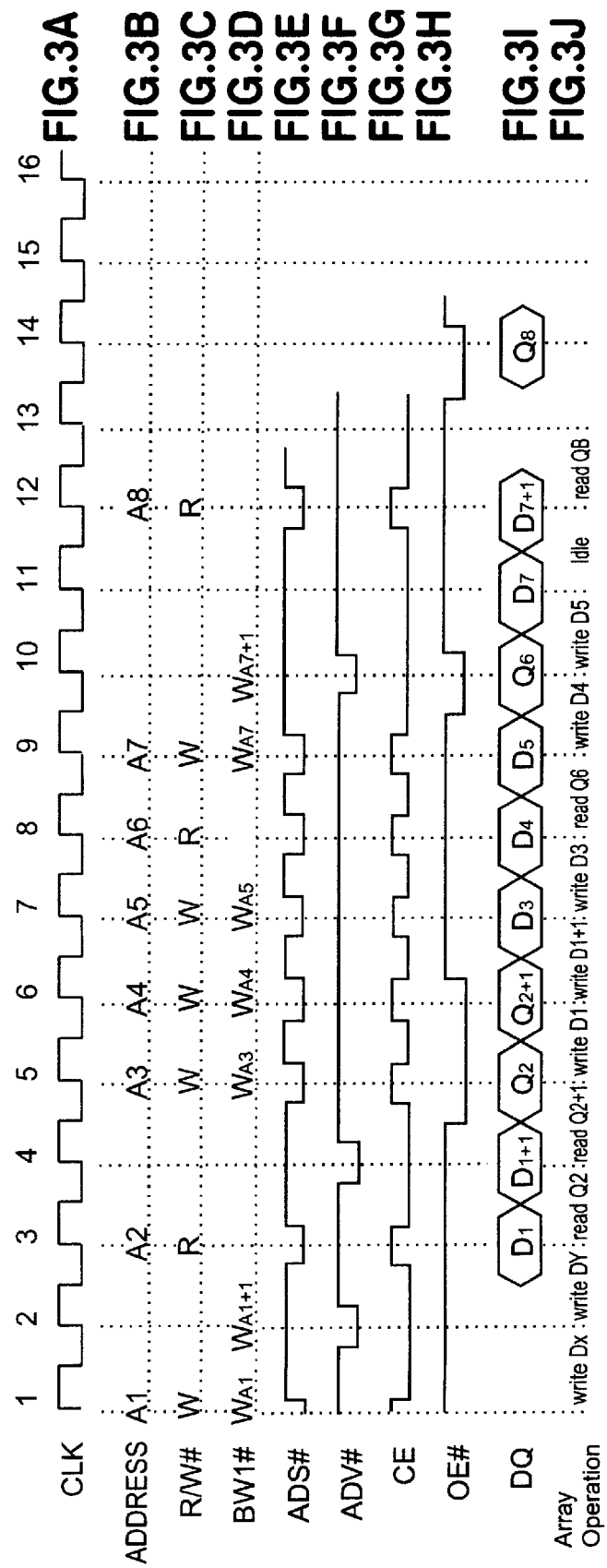
FIGS. 3A–3J are timing diagrams illustrating signals present in the memory device from FIG. 2.

As illustrated in FIGS. 3 and 4, the present invention also includes a method of eliminating idle cycles in a memory device 12. The method includes storing data associated with a first address in the first data input register 70, storing data associated with a second address in the second data input register 72, storing data indicative of the first address in the first write address register 54, storing data indicative of the second address in the second write address register 56, reading data stored in the memory array 34 of the memory device 12, and writing data to the memory array 34 of the memory device 12. The step of writing writes the data stored in one of the first and second data input registers 70, 72 to an address in the memory array 34 indicated by data stored in one of the first and second write address registers 54, 56. Because data indicative of the memory location and the data to be written are stored in the memory device 12, the step of writing may be performed without an idle cycle after the step of reading.

The ordering of the steps may be changed, as will be understood by one of ordinary skill in the art. For example, the step of storing data associated with a first address and the step of storing data indicative of a first address are preferably performed approximately simultaneously. In addition, the step of storing data associated with a second address and the step of storing data indicative of a second address are also preferably performed approximately simultaneously. In addition, one or both of the steps of storing data associated with the first and second address may be performed either before or after one or both of the steps of storing data indicative of the first and second addresses. The steps forming the present invention may also be performed in other sequences.

Those of ordinary skill in the art will recognize that many modifications and variations of the present invention may be implemented. For example, the present invention may be implemented without burst addressing, may be implemented without pipelined output, may be implemented with multiple byte write signals. The foregoing description and the following claims are intended to cover all such modifications and variations.

What is claimed is:

1. A method of operating a memory device, comprising:
    latching a first address into a first write address register prior to a first clock cycle;
    latching data associated with the first address from a data bus of the memory device into a first data input register prior to the first clock cycle;
    reading data associated with a second address from a memory array of the memory device during the first clock cycle;
    providing the first address to the memory array from the first write address register during a second clock cycle immediately subsequent to the first clock cycle; and
    writing the data associated with the first address to the memory array from the first data input register during the second clock cycle.

2. The method of claim 1, wherein reading the data associated with the second address includes:
    sensing the data;
    amplifying the data; and
    providing the data at input terminals of an output register connected to the memory array, wherein the sensing, amplifying, and providing are performed during the first clock cycle.

3. The method of claim 1, wherein reading the data associated with the second address includes reading the data from an address supplied to the memory array during the first clock cycle from a burst logic circuit of the memory device.

4. The method of claim 1, wherein latching the first address into the first write address register is performed simultaneously with latching the data associated with the first address into the first data input register.

5. The method of claim 4, wherein latching the first address into the first write address register and latching the data associated with the first address into the first data input register are performed simultaneously one clock cycle before reading the data associated with the second address from the memory array.

6. The method of claim 1, wherein latching the first address in the first write address register is performed after latching the first address into a second write address register.

7. The method of claim 6, wherein latching the first address into the second write address register is performed one clock cycle prior to latching the first address into the first write address register.

8. The method of claim 6, wherein latching the first address into the second write address register is performed after latching the first address from an address bus of the memory device into an address register.

9. The method of claim 8, wherein latching the first address from the address bus into the address register is performed one clock cycle prior to latching the first address into the second write address register.

10. A method of operating a memory device, comprising:
    latching a first address into a first write address register prior to a first clock cycle;
    latching data associated with the first address from a data bus of the memory device into a first data input register prior to the first clock cycle;
    reading data associated with a second address from a memory array of the memory device prior to the first clock cycle;
    placing the data associated with the second address on the data bus during the first clock cycle;
    reading data associated with a third address from the memory array during the first clock cycle;
    providing the first address to the memory array from the first write address register during a second clock cycle immediately subsequent to the first clock cycle; and
    writing the data associated with the first address to the memory array from the first data input register during the second clock cycle.

11. The method of claim 10, wherein reading the data associated with the second address includes reading the data associated with the second address from the memory array during a clock cycle immediately prior to the first clock cycle.

12. A method of operating a memory device, comprising:
    latching a first address into a first write address register prior to a first clock cycle;
    latching data associated with the first address from a data bus of the memory device into a first data input register prior to the first clock cycle;
    reading data associated with a second address from a memory array of the memory device during the first clock cycle;
    providing the first address from the first write address register to the memory array during a second clock cycle immediately subsequent to the first clock cycle;
    writing the data associated with the first address from the first data input register to the memory array during the second clock cycle; and
    placing the data associated with the second address on the data bus during the second clock cycle.

13. A method of operating a memory device, comprising:
    latching a first address into a first write address register prior to a first clock cycle;
    latching data associated with the first address from a data bus of the memory device into a first data input register prior to the first clock cycle;
    reading data associated with a second address from a memory array of the memory device during the first clock cycle;

providing the first address to the memory array during a second clock cycle immediately subsequent to the first clock cycle;

writing the data associated with the first address to the memory array during the second clock cycle;

latching a third address into the first write address register during a third clock cycle immediately prior to the second clock cycle;

providing the third address to the memory array during the third clock cycle; and writing data associated with the third address from a second data input register to the memory array during the third clock cycle.

14. The method of claim 13, wherein latching the third address into the first write address register is performed after latching the third address into a second write address register.

15. The method of claim 14, wherein latching the third address into the second write address register is performed prior to the first clock cycle.

16. The method of claim 15, wherein latching the third address into the second write address register is performed during a clock cycle immediately prior to the first clock cycle.

17. A method of operating a memory device, comprising:

latching a first address into a first write address register prior to a first clock cycle;

latching data associated with the first address from a data bus of the memory device into a first data input register prior to the first clock cycle;

reading data associated with a second address from a memory array of the memory device during the first clock cycle;

providing the first address to the memory array during a second clock cycle immediately subsequent to the first clock cycle;

writing the data associated with the first address to the memory array during the second clock cycle;

placing the data associated with the second address on the data bus during the second clock cycle;

latching a third address into the first write address register during a third clock cycle immediately subsequent to the second clock cycle;

providing the third address to the memory array during the third clock cycle; and writing data associated with the third address from a second data input register to the memory array during the third clock cycle.

18. A method of operating a memory device, comprising:

latching a first address into a first write address register prior to a first clock cycle;

latching data associated with the first address from a data bus of the memory device into a first data input register prior to the first clock cycle;

reading data associated with a second address from a memory array of the memory device during the first clock cycle;

providing the first address to the memory array during a second clock cycle immediately subsequent to the first clock cycle;

writing the data associated with the first address to the memory array during the second clock cycle;

latching a third address into the first write address register during a third clock cycle immediately prior to the second clock cycle;

latching data associated with the third address into a second data input register prior to the third clock cycle;

providing the third address to the memory array during the third clock cycle; and writing data associated with the third address from the second data input register to the memory array during the third clock cycle.

19. The method of claim 18, wherein latching the data associated with the third address from the data bus is performed prior to the second clock cycle.

20. A method of operating a memory device, comprising:

latching a first address into a first write address register prior to a first clock cycle;

latching data associated with the first address from a data bus of the memory device into a first data input register prior to the first clock cycle;

reading data associated with a second address from a memory array of the memory device prior to the first clock cycle;

placing the data associated with the second address on the data bus during the first clock cycle;

reading data associated with a third address from the memory array during the first clock cycle;

providing the first address to the memory array during a second clock cycle immediately subsequent to the first clock cycle;

writing the data associated with the first address to the memory array during the second clock cycle;

latching a fourth address into the first write address register during a third clock cycle immediately prior to the second clock cycle;

providing the fourth address to the memory array during the third clock cycle; and writing data associated with the fourth address from a second data input register to the memory array during the third clock cycle.

21. A method of operating a memory device, comprising:

latching a first address into a first write address register prior to a first clock cycle;

latching data associated with the first address from a data bus of the memory device into a first data input register prior to the first clock cycle;

reading data associated with a second address from a memory array of the memory device prior to the first clock cycle;

latching a third address from an address register of the memory device prior to the first clock cycle;

providing the third address to the memory array prior to the first clock cycle;

placing the data associated with the second address on the data bus during the first clock cycle;

reading data associated with a third address from the memory array during the first clock cycle;

providing the first address to the memory array during a second clock cycle immediately subsequent to the first clock cycle;

writing the data associated with the first address to the memory array during the second clock cycle;

latching the fourth address into the first write address register during a third clock cycle immediately prior to the second clock cycle;

providing the fourth address to the memory array during the third clock cycle; and writing data associated with the fourth address from a second data input register to the memory array during the third clock cycle.

22. A method of operating a memory device, comprising:
latching a first address into a first write address register prior to a first clock cycle;
latching data associated with the first address from a data bus of the memory device into a first data input register prior to the first clock cycle;
reading data associated with a second address from a memory array of the memory device prior to the first clock cycle;
placing the data associated with the second address on the data bus during the first clock cycle;
reading data associated with a third address from a memory array of the memory device during the first clock cycle;
providing the first address to the memory array during a second clock cycle immediately subsequent to the first clock cycle;
writing the data associated with the first address to the memory array during the second clock cycle;
placing the data associated with the third address on the data bus during the second clock cycle;
latching a fourth address into the first write address register during a third clock cycle immediately prior to the second clock cycle;
providing the fourth address to the memory array during the third clock cycle; and
writing data associated with the fourth address from a second data input register to the memory array during the third clock cycle.

23. A method of operating a memory device, comprising:
latching a first address into a first write address register prior to a first clock cycle;
latching data associated with the first address from a data bus of the memory device into a first data input register prior to the first clock cycle;
reading data associated with a second address from a memory array of the memory device during the first clock cycle;
providing the first address to the memory array during a second clock cycle immediately subsequent to the first clock cycle;
writing the data associated with the first address to the memory array during the second clock cycle;
latching a third address into the first write address register during a third clock cycle immediately subsequent to the second clock cycle;
providing the third address to the memory array during the third clock cycle;
writing data associated with the third address from a second data input register to the memory array during the third clock cycle;
latching a fourth address into the first write address register during a fourth clock cycle immediately subsequent to the third clock cycle;
providing the fourth address to the memory array during the fourth clock cycle; and
writing data associated with the fourth address from the second data input register to the memory array during the fourth clock cycle.

24. The method of claim 23, wherein latching the fourth address into the first write address register is performed after latching the fourth address into a second write address register.

25. The method of claim 24, wherein latching the fourth address into the second write address register is performed during the third clock cycle.

26. The method of claim 25, wherein latching the fourth address into the second write address register is performed after latching the fourth address from an address bus of the memory device into an address register.

27. The method of claim 26, wherein latching the fourth address from the address bus into the address register is performed during second clock cycle.

28. The method of claim 23, wherein writing the data associated with the fourth address to the memory array is performed after latching the data associated with the fourth address from the data bus.

29. The method of claim 28, wherein latching the data associated with the fourth address is performed during the fourth clock cycle.

30. The method of claim 29, wherein writing the data associated with the fourth address to the memory array is performed prior to latching the data associated with the fourth address from the second data input register into the first data input register.

31. A method of operating a memory device, comprising:
latching a first address into a first write address register prior to a first clock cycle;
latching data associated with the first address from a data bus of the memory device into a first data input register prior to the first clock cycle;
reading data associated with a second address from a memory array of the memory device during the first clock cycle;
providing the first address to the memory array during a second clock cycle immediately subsequent to the first clock cycle;
writing the data associated with the first address to the memory array during the second clock cycle;
latching a third address into the first write address register during a third clock cycle immediately subsequent to the second clock cycle;
providing the third address to the memory array during the third clock cycle;
writing data associated with the third address from a second data input register to the memory array during the third clock cycle;
latching a fourth address into the first write address register during a fourth clock cycle immediately subsequent to the third clock cycle;
providing the fourth address to the memory array during the fourth clock cycle;
writing data associated with the fourth address from the second data input register to the memory array during the fourth clock cycle;
latching a fifth address from the address bus during a fifth clock cycle immediately prior to the fourth clock cycle;
providing the fifth address to the memory during the fifth clock cycle; and
reading data associated with the fifth address from the memory array during the fifth clock cycle.

32. A method of operating a memory device, comprising:
latching a first address into a first write address register;
latching a second address into a second write address register;
latching data associated with the first address into a first data input register;

latching data associated with the second address into a second data input register;

reading data associated with a third address from a memory array of the memory device during a first clock cycle;

providing the first address from the first write address register to the memory array during a second clock cycle immediately subsequent to the first clock cycle; and writing the data associated with the first address from the second write data input register to memory array during the second clock cycle.

33. The method of claim 32, wherein latching the first address into the first write address register and latching the second address into the second write address register are performed prior to the first clock cycle.

34. The method of claim 33, wherein latching the first address into the first write address register and latching the second address into the second write address register are performed approximately simultaneously.

35. The method of claim 33, wherein latching the data associated with the first address and latching the data associated with the second address are performed approximately simultaneously.

36. The method of claim 32, wherein:

latching the data associated with the first address includes latching the data associated with the first address from the second data input register into the first data input register; and latching the data associated with the second address includes latching the data associated with the second address from a data bus of the memory device into the second data input register.

37. A method of operating a memory device, comprising:

latching a first address into a first write address register;

latching a second address into a second write address register;

latching data associated with the first address into a first data input register from a second data input register;

latching data associated with the second address into a second data input register from a data bus of the memory device;

reading data associated with a third address from a memory array of the memory device during a first clock cycle;

providing the first address from the first write address register to the memory array during a second clock cycle immediately subsequent to the first clock cycle;

writing the data associated with the first address from the second write data input register to memory array during the second clock cycle; and placing the data associated with the third address on the data bus during the second clock cycle.

38. A method of operating a memory device, comprising:

latching a first address into a first write address register;

latching a second address into a second write address register;

latching data associated with the first address into a first data input register from a second data input register;

latching data associated with the second address into a second data input register from a data bus of the memory device;

reading data associated with a third address from the memory array prior to a first clock cycle;

reading data associated with a fourth address from a memory array of the memory device during the first clock cycle;

placing the data associated with the third address on the data bus during the first clock cycle;

providing the first address from the first write address register to the memory array during a second clock cycle immediately subsequent to the first clock cycle;

writing the data associated with the first address from the second write data input register to memory array during the second clock cycle; and placing the data associated with the fourth address on the data bus during the second clock cycle.

39. The method of claim 38, wherein reading the data associated with the third address includes reading the data associated with the third address from the memory array during the clock cycle immediately prior to the first clock cycle.

40. A method of operating a memory device, comprising:

latching a first address into a first write address register;

latching a second address into a second write address register;

latching data associated with the first address into a first data input register from a second data input register;

latching data associated with the second address into a second data input register from a data bus of the memory device;

latching a third address from an address register of the memory device prior to a first clock cycle;

providing the third address to the memory array prior to the first clock cycle;

reading data associated with the third address from the memory array during the clock cycle immediately prior to the first clock cycle;

reading data associated with a fourth address from a memory array of the memory device during the first clock cycle;

placing the data associated with the third address on the data bus during the first clock cycle;

providing the first address from the first write address register to the memory array during a second clock cycle immediately subsequent to the first clock cycle;

writing the data associated with the first address from the second write data input register to memory array during the second clock cycle; and placing the data associated with the fourth address on the data bus during the second clock cycle.

41. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address; and providing the data associated with the second address from the second data input register to an output register of the memory array when the first and second addresses match.

42. The method of claim 41, wherein latching the first, second, and third addresses are performed approximately simultaneously.

43. The method of claim 42, wherein latching the data associated with the second address and latching the data associated with the third address are performed approximately simultaneously.

44. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address;

providing the data associated with the second address from the second data input register to an output register of the memory array when the first and second addresses match; and writing the data associated with the second address to a memory array of the memory device when the first and second addresses do not match.

45. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address;

providing the data associated with the second address from the second data input register to an output register of the memory array when the first and second addresses match; and driving the data associated with the second address from the output register of the memory device to the data bus after providing the data associated with the second address to the output register.

46. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address;

providing the data associated with the second address from the second data input register to an output register of the memory array when the first and second addresses match;

comparing the first address and the third address; and providing the data associated with the third address from the first data input register to the output register of the memory array when the first and third addresses match.

47. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address;

providing the data associated with the second address from the second data input register to an output register of the memory array when the first and second addresses match;

comparing the first address and the third address;

providing the data associated with the third address from the first data input register to the output register of the memory array when the first and third addresses match; and driving the data associated with the third address from the output register of the memory device to the data bus after providing the data associated with the third address to the output register.

48. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the second address;

providing the data associated with the second address from the second data input register to an output register of the memory array when the first and second addresses match;

comparing the first address and the third address;

providing the data associated with the third address from the first data input register to the output register of the memory array when the first and third addresses match; and writing the data associated with the third address to the memory array when the first and third addresses do not match.

49. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the third address; and providing the data associated with the third address from the first data input register to an output buffer of the memory array when the first and third addresses match.

50. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the third address;

providing the data associated with the third address from the first data input register to an output buffer of the memory array when the first and third addresses match; and writing the data associated with the third address to a memory array of the memory device when the first and third addresses do not match.

51. A method of operating a memory device, comprising:

latching a first address from an address bus of the memory into an address register;

latching a second address into a first write address register;

latching a third address from the first write address register into a second write address register;

latching data associated with the third address from a data bus of the memory device into a first data input register;

latching data associated with the second address from the first data input register into a second data input register;

comparing the first address and the third address; and providing the data associated with the third address from the first data input register to an output buffer of the memory array when the first and third addresses match; and driving the data associated with the third address from the output register of the memory device to the data bus after providing the data associated with the third address to the output register.

* * * * *

UNITED STATES PATENT AND TRADEMARK OFFICE
CERTIFICATE OF CORRECTION

PATENT NO. : 6,215,724 B1
DATED : April 10, 2001
INVENTOR(S) : Pawlowski

It is certified that error appears in the above-identified patent and that said Letters Patent is hereby corrected as shown below:

<u>Column 10,</u>
Line 37, after the words "present at", please insert the word -- the -- immediately thereafter.

Signed and Sealed this

Thirtieth Day of October, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO. : 6,215,724 B1 Page 1 of 1
APPLICATION NO. : 09/525868
DATED : April 10, 2001
INVENTOR(S) : Pawlowski It is certified that error appears in the above-identified patent and that said Letters Patent is hereby corrected as shown below:

<u>COLUMN 10</u>

Line 37, after the words "present at", please insert the word --the-- immediately thereafter.

Signed and Sealed this

Tenth Day of July, 2007

JON W. DUDAS
*Director of the United States Patent and Trademark Office*